(12) United States Patent
Fujikawa

(10) Patent No.: US 11,385,490 B2
(45) Date of Patent: Jul. 12, 2022

(54) ELECTRO-OPTICAL PANEL, ELECTRO-OPTICAL DEVICE, AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 13 days.

(21) Appl. No.: 16/935,568

(22) Filed: Jul. 22, 2020

(65) Prior Publication Data
US 2021/0026189 A1    Jan. 28, 2021

(30) Foreign Application Priority Data

Jul. 23, 2019 (JP) .............................. JP2019-135178

(51) Int. Cl.
*G02F 1/1333* (2006.01)
*G02F 1/1343* (2006.01)

(52) U.S. Cl.
CPC .. *G02F 1/133382* (2013.01); *G02F 1/134309* (2013.01); *G02F 2201/50* (2013.01)

(58) Field of Classification Search
CPC ......... G02F 1/133382; G02F 1/134309; G02F 2201/50
USPC ......................................................... 349/96
See application file for complete search history.

(56) References Cited

U.S. PATENT DOCUMENTS

| 6,414,740 B1* | 7/2002 | Hosoyamada ....... G09G 3/3648 349/161 |
| 2004/0017437 A1 | 1/2004 | Yamaguchi et al. |
| 2007/0284509 A1 | 12/2007 | Kobashi |
| 2008/0143652 A1 | 6/2008 | Hasegawa et al. |
| 2009/0080154 A1 | 3/2009 | Hirabayashi et al. |
| 2016/0284446 A1* | 9/2016 | Fujikawa ................ H01L 27/04 |

FOREIGN PATENT DOCUMENTS

| JP | 2000-338518 A | 12/2000 |
| JP | 3229792 B2 | 11/2001 |
| JP | 2002-122838 A | 4/2002 |
| JP | 2004-50637 A | 2/2004 |
| JP | 4175384 B2 | 11/2008 |
| JP | 4238913 B2 | 3/2009 |
| JP | 2009-169329 A | 7/2009 |
| JP | 5504557 B2 | 5/2014 |
| JP | 2016-184719 A | 10/2016 |

* cited by examiner

*Primary Examiner* — Nathanael R Briggs
*Assistant Examiner* — William D Peterson
(74) *Attorney, Agent, or Firm* — Oliff PLC

(57) ABSTRACT

In an electro-optical device, a temperature detection element is provided on a first substrate having a pixel region, on which a plurality of pixel electrodes are provided, in a position overlapping a light shielding portion that is formed on a second substrate so as to surround the pixel region. Further, the first substrate is provided with an electrostatic protection circuit that includes a semiconductor element and is electrically coupled to the temperature detection element. The semiconductor element is disposed in a position which is farther distanced from the center of the pixel region than the temperature detection element is, and at which a temperature is lower than a temperature at a position in which the temperature detection element is provided.

14 Claims, 13 Drawing Sheets

ELECTRO-OPTICAL PANEL, ELECTRO-OPTICAL DEVICE, AND ELECTRONIC APPARATUS

The present application is based on, and claims priority from JP Application Serial Number 2019-135178, filed Jul. 23, 2019, the disclosure of which is hereby incorporated by reference herein in its entirety.

BACKGROUND

1. Technical Field

The present disclosure relates to an electro-optical panel in which a temperature detection element is provided on a substrate, an electro-optical device, and an electronic apparatus.

2. Related Art

In an electro-optical device, such as a liquid crystal device and an organic electroluminescence display device, when an image is displayed in a pixel region in which a plurality of pixels are arranged, the temperature of the electro-optical panel increases. For example, in a projection-type display device, since illumination light is irradiated in the pixel region at high intensity in a liquid crystal device used as a light valve, the temperature of a liquid crystal panel increases. In such a case, although modulation characteristics and response characteristics of a liquid crystal layer change, if the projection-type display device is controlled based on a detection result of the temperature of the liquid crystal panel, an effect of the temperature on the image can be mitigated. For example, when a cooling fan provided in the projection-type display device is controlled based on the detection result of the temperature of the liquid crystal panel, the effect of the temperature on the image can be mitigated.

On the other hand, as a method for detecting the temperature of the liquid crystal panel, it is conceivable to adopt a configuration in which a temperature detection element and an electrostatic protection circuit for the temperature detection element are provided in a corner of a substrate in which pixels are formed (see JP-A-2016-184719).

Since the temperature of the pixel region is highest in the liquid crystal panel, it is preferable to detect the temperature of the pixel region. However, as in the technology described in JP-A-2016-184719, when the temperature detection element and the electrostatic protection circuit are provided in the corner of the substrate in which the pixels are formed, because the temperature detection element is significantly separated from the pixel region, it is difficult to properly detect the temperature of the pixel region. On the other hand, when the temperature detection element and the electrostatic protection circuit are provided in the vicinity of the pixel region, when the temperature of the pixel region increases, a leakage current of a semiconductor element, which is electrically coupled in parallel with the temperature detection element in the electrostatic protection circuit, increases, and this causes an output from the temperature detection element to fluctuate. Thus, in a known configuration, there is a problem in that the temperature of the pixel region cannot be properly monitored.

SUMMARY

In order to solve the above-described problem, an aspect of the electro-optical panel according to the present disclosure includes a first substrate having a pixel region provided with a plurality of pixels, a temperature detection element provided at the first substrate, an electrostatic protection circuit provided at the first substrate and electrically coupled to the temperature detection element. The electrostatic protection circuit includes a semiconductor element, and the semiconductor element is disposed in a position at which temperature is lower than temperature in a position at which the temperature detection element of the first substrate is provided.

Another aspect of the electro-optical panel according to the present disclosure includes a first substrate having a pixel region provided with a plurality of pixels, a temperature detection element provided at the first substrate, an electrostatic protection circuit provided at the first substrate and electrically coupled to the temperature detection element. The electrostatic protection circuit includes a semiconductor element, and the semiconductor element is disposed in a position further distanced from a center of the pixel region of the first substrate than the temperature detection element is.

The electro-optical device according to an aspect of the present disclosure can be used for various electronic apparatuses. When the electronic apparatus is a projection-type display device, the electronic apparatus includes a light-source unit configured to emit light-source light to be supplied to the electro-optical device, and a projection optical system configured to project light modulated by the electro-optical device.

DESCRIPTION OF EXEMPLARY EMBODIMENTS

Figure 1:
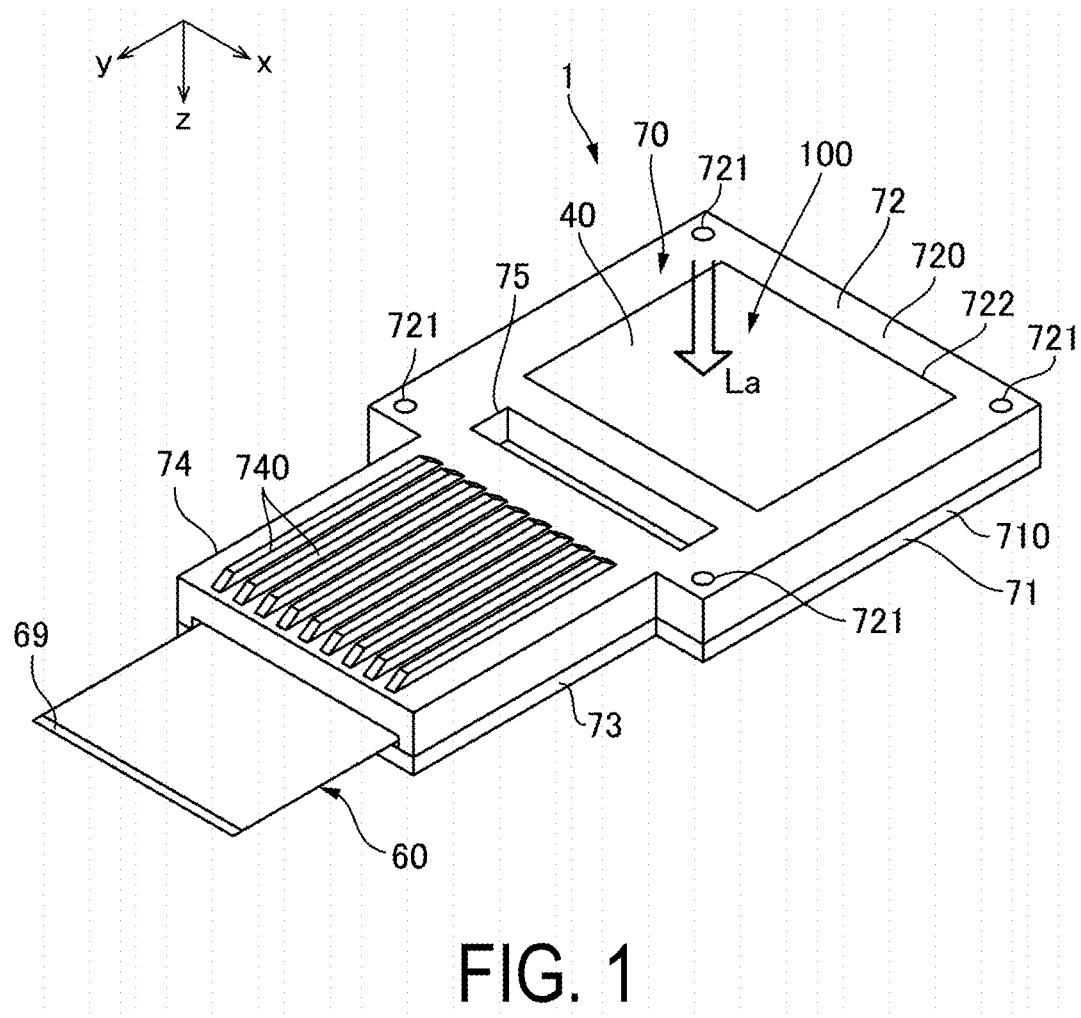
FIG. 1 is a perspective view illustrating a form of an electro-optical device to which the present disclosure is applied.

Exemplary embodiments of the disclosure will be described below with reference to the drawings. Note that, in each of the drawings to be referenced in descriptions below, to make each member and the like recognizable in terms of size in the drawings, the members and the like are illustrated in different scales, and numbers of the members are reduced. In the descriptions below, directions are expressed using an orthogonal coordinate system consisting of an x-axis, a y-axis, and a z-axis. The z-axis direction is a thickness direction of an electro-optical device 1, the y-axis direction is an extending direction of a wiring substrate, and the x-axis direction is a width direction orthogonal to the extending direction of the wiring substrate.

Configuration of Electro-Optical Device 1 Basic Configuration

Figure 2:
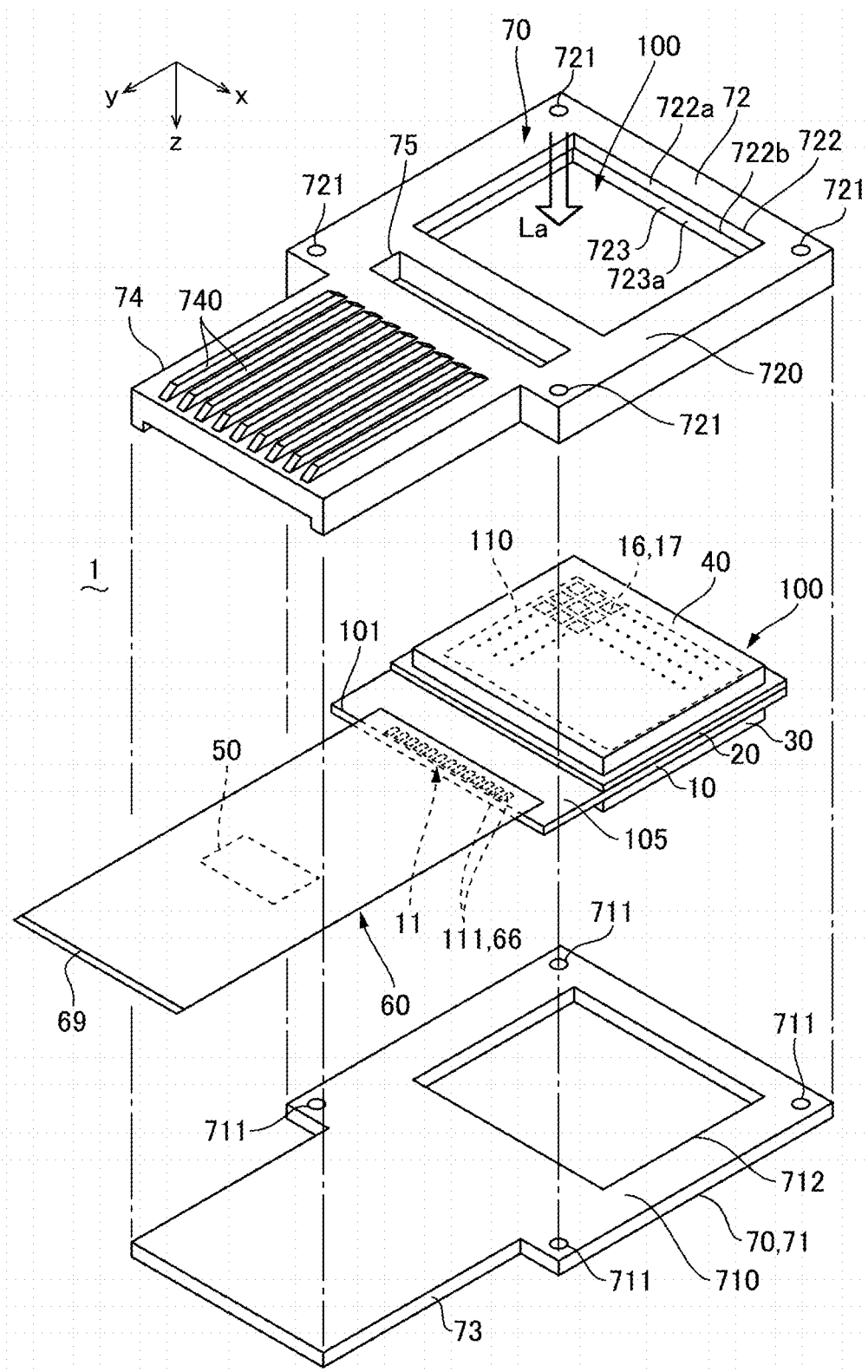
FIG. 2 is an exploded perspective view of the electro-optical device illustrated in FIG. 1.
Figures 3A, 3B:
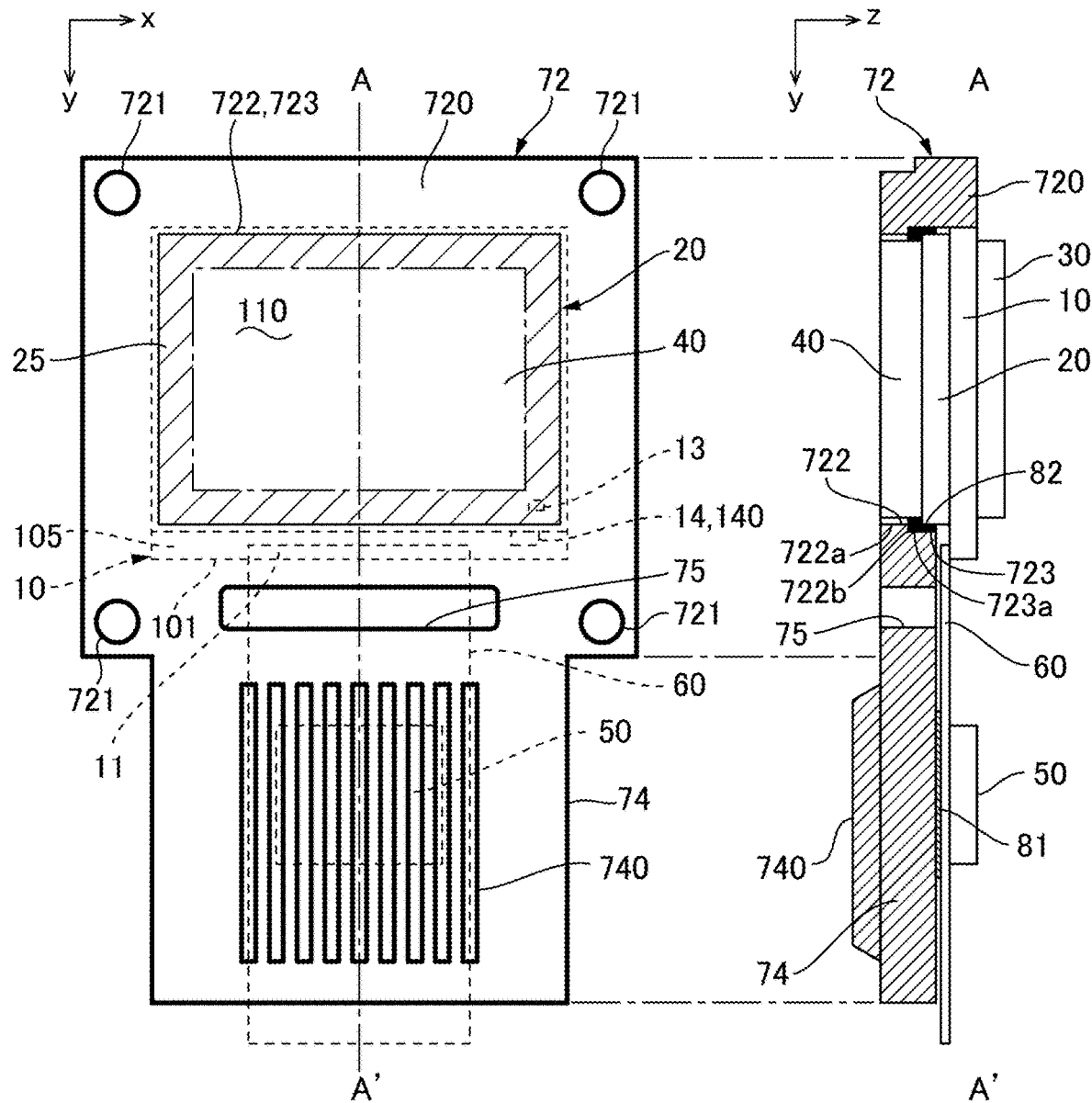
FIGS. 3A and 3B are explanatory diagrams of a holder illustrated in FIG. 1.

FIG. 1 is a perspective view illustrating a form of the electro-optical device 1 to which the present disclosure is applied. FIG. 2 is an exploded perspective view of the electro-optical device 1 illustrated in FIG. 1. FIGS. 3A and 3B are explanatory diagrams of a holder 70 illustrated in FIG. 1. FIG. 3A illustrates a plan view of the holder 70 and the like, and FIG. 3B illustrates a cross-sectional view of the holder 70 and the like. Note that in FIGS. 3A and 3B, of the holder 70, only a second holder member 72 provided on a second substrate 20 side is illustrated.

In FIG. 1, FIG. 2, and FIGS. 3A and 3B, the electro-optical device 1 is a liquid crystal device used as a light valve and the like, which will be described below, and includes a liquid crystal panel that is an electro-optical panel 100. The electro-optical device 1 is provided with a plurality of pixel electrodes 16 formed on a first substrate 10, a common electrode (not illustrated) formed on the second substrate 20, and a liquid crystal layer (not illustrated) provided between the pixel electrodes 16 and the common electrode. Here, the pixel electrode 16 formed on the first substrate 10 configures a pixel 17 by facing the common electrode with the liquid crystal layer interposed therebetween. In the electro-optical device 1, the second substrate 20 is bonded to the first substrate 10 by a seal material (not illustrated). In the electro-optical panel 1, the liquid crystal layer (not illustrated) is provided in a region surrounded by the seal material.

The electro-optical device 1 of the present exemplary embodiment is a transmission-type liquid crystal device. Therefore, a substrate main body of the first substrate 10 and a substrate main body of the second substrate 20 are each formed by a transmissive substrate, such as heat-resistant glass or a quartz substrate. In the transmission-type electro-optical device 1 configured in this manner, for example, illumination light incident from one of the first substrate 10 and the second substrate 20 is modulated while exiting from a side of the other substrate, and emitted as display light. In the present exemplary embodiment, as indicated by an arrow La in FIG. 1, the illumination light incident from the second substrate 20 side is modulated while exiting from the first substrate 10 side, and emitted as the display light.

The electro-optical panel 1 includes a transmissive first dust-proof glass 30 that is layered and bonded onto a surface, opposite from the second substrate 20, of the first substrate via an adhesive or the like, and a transmissive second dust-proof glass 40 that is layered and bonded onto a surface, opposite from the first substrate 10, of the second substrate 20 via the adhesive or the like.

In the electro-optical device 1, a region in which the pixel electrodes 16 (the pixels 17) are arranged in the x-axis direction and the y-axis direction is a pixel region 110, and a display region is configured by all or a portion of the pixel region 110.

The first substrate 10 includes a protruding portion 105 protruding in the y-axis direction further than an end portion of the second substrate 20. The protruding portion 105 is provided with a terminal region 11 in which a plurality of terminals 111 are arranged at a predetermined pitch along a first long side portion 101 extending in the width direction (the x-axis direction) of the first substrate 10. The electro-optical device 1 includes a flexible wiring substrate 60 coupled to the terminal region 11, and the wiring substrate 60 extends in the y-axis direction so as to separate from the first substrate 10. The wiring substrate 60 includes electrodes 66, which are coupled to the terminals 111 via an anisotropic conductive film or the like, in an end portion thereof on the first substrate 10 side, while a terminal 69, such as a board-to-board connector, is formed in an end portion of the wiring substrate 60 on the opposite side from the side coupled to the first substrate 10. Further, a drive integrated circuit (IC) 50 is mounted on the wiring substrate 60, at a partway position in the extending direction.

The electro-optical device 1 includes the holder 70 that supports the electro-optical panel 100 from both sides in the thickness direction (the z-axis direction). The holder 70 includes a first holder member 71 that is formed of metal and supports the electro-optical panel 100 from the first substrate 10 side, and a second holder member 72 that is formed of metal and supports the electro-optical panel 100 from the second substrate 20 side. The first holder member 71 includes a frame 710 that is formed such that an emission window 712 that emits the display light overlaps at least with the pixel region 110, and the frame 710 supports the electro-optical panel 100 from the first substrate 10 side. The metal configuring the first holder member 71 and the second holder member 72 is aluminum, magnesium, or the like, that has good thermal conductivity.

The second holder member 72 includes a frame 720 that is formed such that a substrate arrangement hole 722, on which the illumination light is incident, overlaps with at least the pixel region 110, and the frame 720 supports the electro-optical panel 100 from the second substrate 20 side.

In the present exemplary embodiment, the substrate arrangement hole 722 has a size inside which the second dust-proof glass 40 can be accommodated. Of the inside of the substrate arrangement hole 722, a side closer to the first substrate 10 than a stepped portion 722b formed in a side wall 722a is formed as a first recessed portion 723 in which the second substrate is disposed, and the second holder member 72 is fixed to the second substrate 20 and the second dust-proof glass 40 by a heat conductive adhesive 82 provided on the stepped portion 722a and a side wall 723a of the first recessed portion 723. The first holder member 71 and the second holder member 72 are joined together by a method such as screwing bolts (not illustrated) into four pairs of bolt holes 711 and 721 respectively formed in the frame 710 of the first holder member 71 and the frame 720 of the second holder member 72.

The holder 70 includes a heat dissipation portion 74 extending in the y-axis direction from the frame 720 of the second holder member 72 so as to overlap with the wiring substrate 60, and a plurality of heat dissipation fins 740 are formed on the heat dissipation portion 74. Further, the holder 70 includes a heat dissipation portion 73 extending in the y-axis direction from the frame 710 of the first holder member 71 so as to overlap with the wiring substrate 60, and similarly to the heat dissipation portion 74, a plurality of heat dissipation fins (not illustrated) are formed on the heat dissipation portion 73. The heat dissipation portion 73 and the heat dissipation portion 74 overlap with a region of the wiring substrate 60 on which a drive IC 50 is mounted, from both sides in the z-axis direction. At this time, a heat conduction member 81, such as silicon grease, is provided between a section overlapping with the drive IC 50 and the heat dissipation portion 74, of a surface of the wiring substrate 60 on the opposite side from the drive IC 50.

In the second holder member 72, a slit-shaped through-hole 75 extending in the x-axis direction is formed between the frame 720 and the heat dissipation portion 74, and the through-hole 75 suppresses transfer of heat generated by the drive IC 50 to the electro-optical panel 100.

Configuration of Electro-Optical Panel 100

Figure 4:
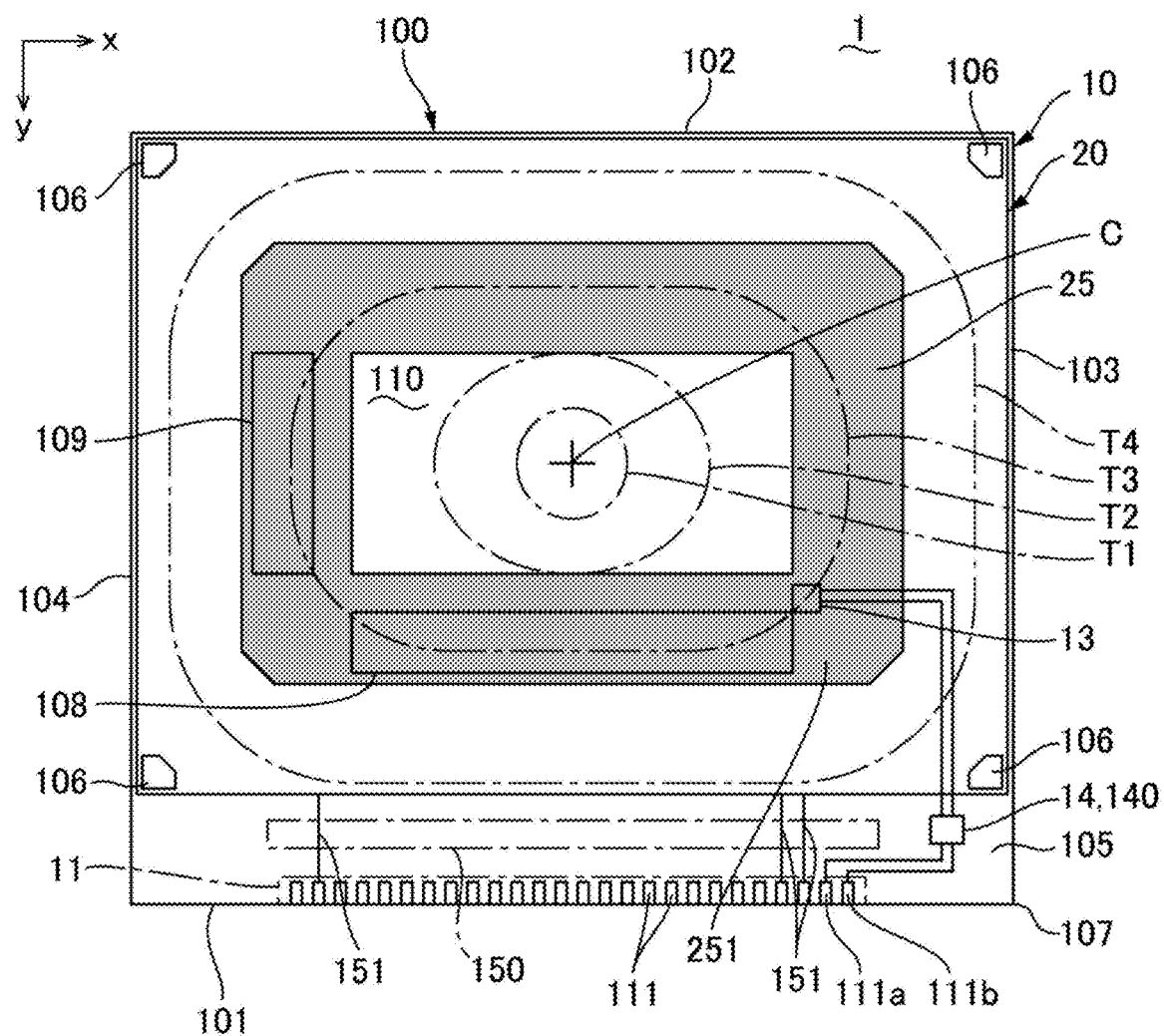
FIG. 4 is an explanatory diagram of an electro-optical panel illustrated in FIG. 2.

FIG. 4 is an explanatory diagram of the electro-optical panel 100 illustrated in FIG. 2, and schematically illustrates a planar configuration of the electro-optical panel 100. In FIG. 4, in particular, a gap between an end portion of the second substrate 20 and a light shielding portion 25 is illustrated in a widened manner. As illustrated in FIG. 4, in the electro-optical panel 100, the frame-shaped light shielding portion 25 is formed on the second substrate 20, and the pixel region 110 is formed inside the light shielding portion 25. Inter-substrate conduction portions 106 are provided in positions, of the first substrate 10, overlapping with corner portions of the second substrate 20. Thus, a common potential is supplied from the first substrate 10 side to the common electrode of the second substrate 20 via the inter-substrate conduction portions 106.

On the first substrate 10, a data line drive circuit 108 is provided between the terminal region 11 and the pixel region 110. The data line drive circuit 108 supplies image signals to the plurality of pixel electrodes 16 illustrated in FIG. 2 via data lines (not illustrated) and pixel switching elements (not illustrated). Further, in the first substrate 10, a first short-side portion 103 and a second short-side portion 104 extend in the y-axis direction from both ends of the first long side portion 101, and a scanning line drive circuit 109 is provided between the second short-side portion 104 and the pixel region 110. The scanning line drive circuit 109 supplies scanning signals to the pixel switching elements via scanning lines (not illustrated). The scanning line drive circuit 109 may be provided both between the second short-side portion 104 and the pixel region 110 and between the first short-side portion 103 and the pixel region 110. In the present exemplary embodiment, the data line drive circuit 108 and the scanning line drive circuit 109 overlap with the light shielding portion 25 of the second substrate 20. Further, on the first substrate 10, an inspection circuit (not illustrated) may also be provided between a second long side portion 102 facing the first long side portion 101 and the pixel region 110.

Configuration of Temperature Detection Element 13 and Electrostatic Protection Circuit 14

Figure 5A:
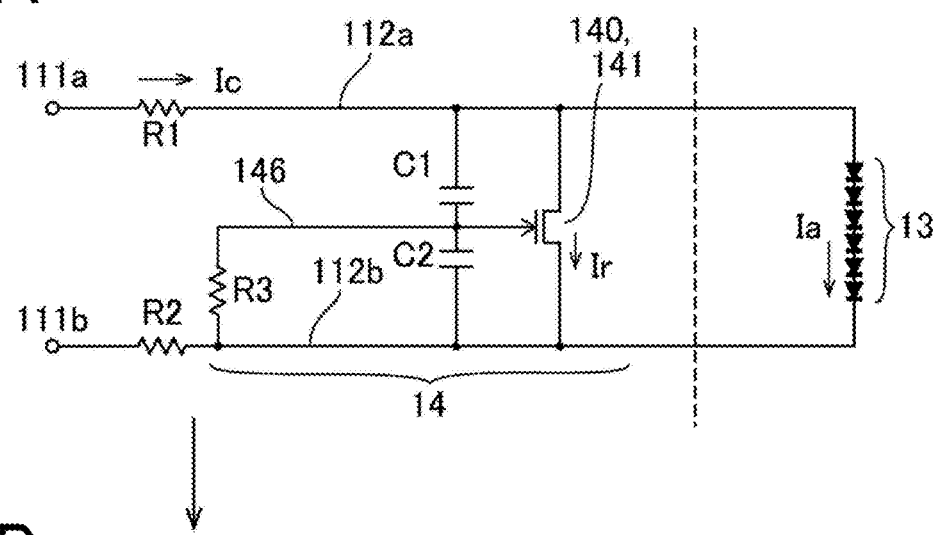
FIGS. 5A and 5B are explanatory diagrams of a temperature detection element and an electrostatic protection circuit illustrated in FIG. 4.
Figure 5B:
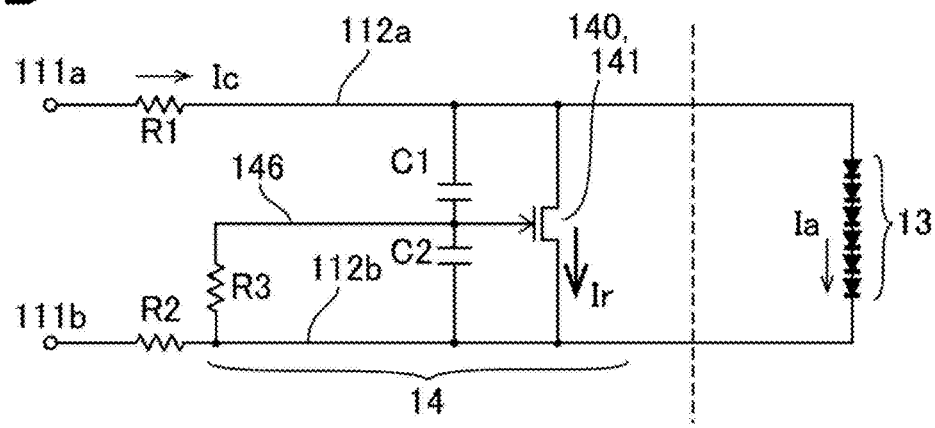
Figure 6:
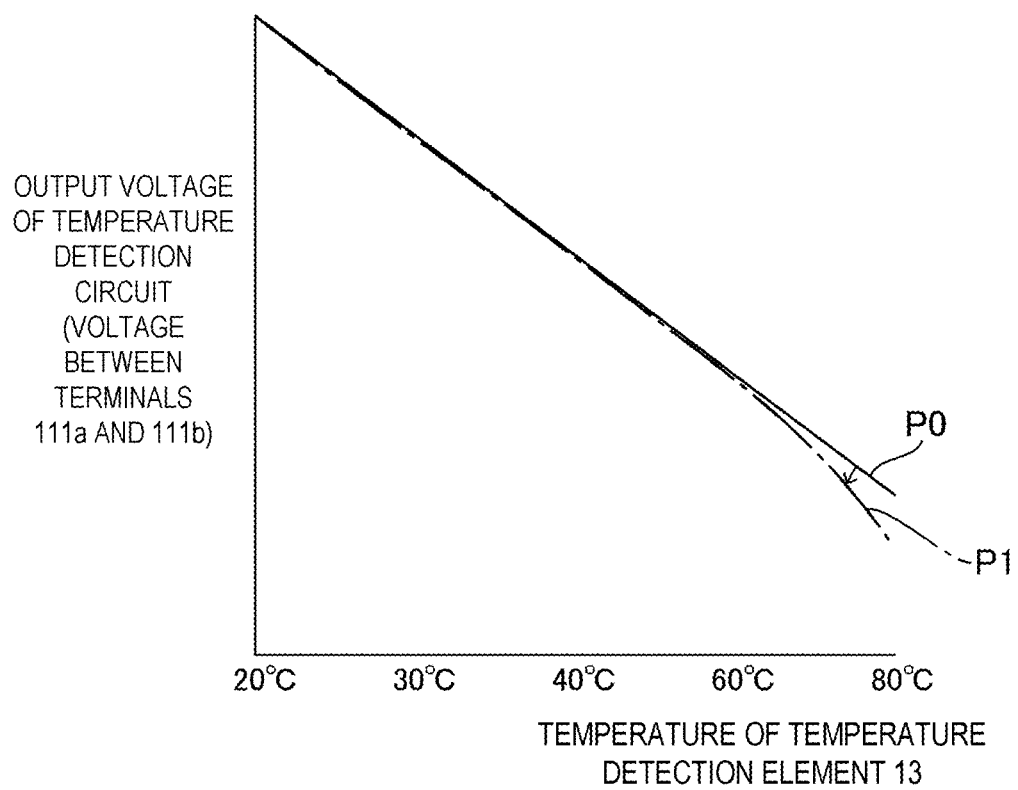
FIG. 6 is an explanatory diagram illustrating temperature characteristics and the like of the temperature detection element illustrated in FIGS. 5A and 5B.

FIGS. 5A and 5B are explanatory diagrams of a temperature detection element 13 and an electrostatic protection circuit 14 illustrated in FIG. 4. FIG. 5A illustrates electric current components at room temperature, and FIG. 5B illustrates the electric current components when the temperature has risen. FIG. 6 is an explanatory diagram illustrating temperature characteristics and the like of the temperature detection element 13 illustrated in FIGS. 5A and 5B. Note that the temperature detection element 13 and the electrostatic protection circuit 14 are also collectively referred to as a temperature detection circuit.

In FIG. 4, the temperature detection element 13 and the electrostatic protection circuit 14 that is electrically coupled to the temperature detection element 13 are provided on the first substrate 10. In the present exemplary embodiment, both the temperature detection element 13 and the electrostatic protection circuit 14 are formed using a process of forming the pixel switching elements and the like on the first substrate 10.

As illustrated in FIGS. 5A and 5B, the temperature detection element 13 is formed by diodes. In the present exemplary embodiment, the temperature detection element 13 includes a plurality of the diodes coupled in series to increase detection sensitivity to a temperature change. The diode need not necessarily be a PN junction, but may be in the form of a diode-coupled transistor. Two wiring lines 112a and 112b respectively extending from two terminals 111a and 111b of the terminals 111 illustrated in FIG. 4 are electrically coupled to both ends of the temperature detection element 13, and resistors R1 and R2 are respectively coupled to partway positions of the wiring lines 112a and 112b. Therefore, when a micro constant current Ic of approximately 100 nA to several μA is supplied in a forward direction from the terminal 111a to the temperature detection element 13 (the diodes), a current Ia flows through the temperature detection element 13. Here, as illustrated by a solid line P0 in FIG. 6, a forward-direction voltage of the diodes configuring the temperature detection element 13 changes substantially linearly according to the temperature. Therefore, since a voltage between the terminals 111a and 111b changes depending on the temperature, the temperature can be detected by detecting the voltage between the terminals 111a and 111b.

Once again with reference to FIGS. 5A and 5B, the electrostatic protection circuit 14 is electrically coupled to the two wiring lines 112a and 112b in parallel with the temperature detection element 13. The electrostatic protection circuit 14 includes a semiconductor element 140 that is electrically coupled in parallel to the temperature detection element 13. In the present exemplary embodiment, the semiconductor element 140 is an n-type field effect transistor 141. A source electrode of the field effect transistor 141 is coupled to the wiring line 112b, and a drain electrode thereof is coupled to the wiring line 112a. A gate electrode of the field effect transistor 141 is coupled to a gate wiring line 146, and the gate wiring line 146 is coupled to the wiring line 112b via a resistor R3. Thus, in a static state, a gate voltage Vgs of the field effect transistor 141 is 0 V, and the field effect transistor 141 is in an off state. Further, a capacitor C1 is coupled between the gate wiring line 146 and the wiring line 112a, and a capacitor C2 is coupled between the gate wiring line 146 and the wiring line 112b.

In the electrostatic protection circuit 14 configured in this manner, when a surge caused by static electricity enters between the terminal 111a and the terminal 111b, a potential on the terminal 111a side increases, for example, and a potential of the gate electrode of the field effect transistor 141 increases due to capacity-divided voltage of the capacitors C1 and C2. Therefore, the field effect transistor 141 is brought into an on state, and thus, a current caused by the surge flows to the terminal 111b via the field effect transistor 141. As a result, since the current caused by the surge is inhibited from flowing to the temperature detection element 13 by the electrostatic protection circuit 14, the temperature detection element 13 can be protected.

Here, if a leakage current Ir flowing from the drain electrode to the source electrode of the n-type field effect transistor 141 is so small as to be negligible in a measured temperature range, the current Ia flowing through the temperature detection element 13 is substantially equal to the constant current Ic supplied from the terminal 111a. Thus, as illustrated by the solid line P0 in FIG. 6, temperature characteristics of an output voltage of the temperature detection circuit are temperature characteristics of the diodes of the temperature detection element 13, and change substantially linearly with respect to the environmental temperature. In other words, a calibration curve can be determined by linear approximation.

The n-type field effect transistor 141 has a relatively large channel width in order to realize a function as a discharge circuit, and, for example, when the temperature thereof increases up to 80° C., the leakage current Ir is no longer negligible. In this case, the current Ia flowing through the temperature detection element 13 has a value obtained by subtracting the leakage current Ir from the constant current Ic. Moreover, the leakage current Ir of the field effect transistor 141 increases exponentially as a result of the temperature increase. Thus, as illustrated by a dot-dash line P1 in FIG. 6, as a result of being affected by the leakage current Ir of the field effect transistor 141, the temperature characteristics of the output voltage of the temperature detection circuit become different from the temperature characteristics of the diodes configuring the temperature detection element 13. More specifically, since the current flowing through the temperature detection element 13 becomes Ic-Ir, the output voltage deviates to an output voltage smaller than that of the original temperature characteristics of the diodes configuring the temperature detection element 13. In particular, the deviation becomes large in a high-temperature region. In other words, it becomes difficult to linearly approximate the temperature characteristics of the output voltage of the temperature detection circuit. In that case, the calibration curve needs to be determined using a multi-point calibration, for example, and an amount of work required to determine the calibration curve becomes huge. This results in increased manufacturing costs. Further, since the calibration curve easily varies due to variations in the leakage current Ir of the field effect transistor 141, productization becomes difficult. As a method for making the leakage current Ir so small as to be negligible, the constant current Ic may be increased. However, in order to increase the constant current Ic, the temperature detection element 13 needs to be enlarged, and this makes it difficult to dispose the temperature detection element 13 in proximity to the pixel region 110.

Such a problem is not a unique problem of the electrostatic protection circuit 14 illustrated in FIGS. 5A and 5B. With respect to the diodes configuring the temperature detection element 13, this problem may occur if a semiconductor element, which forms a discharge circuit with a different potential from an operating point potential of the diodes, is provided on the wiring line on an anode side.

Layout of Temperature Detection Element 13 and Electrostatic Protection Circuit 14

In the present exemplary embodiment, based on the characteristics described with reference to FIGS. 5A and 5B and FIG. 6, the semiconductor element 140 of the electrostatic protection circuit 14 is disposed in a position to which a distance from a center C of the pixel region 110 of the first substrate 10 is greater than a distance from the center C of the pixel region 110 to the temperature detection element 13, as illustrated in FIG. 4. Here, in the electro-optical device 1, when the illumination light is incident, the temperature of the center C of the pixel region 110 is generally highest, and isothermal lines T1, T2, T3, and T4 generally appear substantially concentrically around the center C of the pixel region 110. Therefore, a temperature relationship between the center C of the pixel region 110 and each of the isothermal lines is the center C>T1>T2>T3>T4. The electro-optical panel 100 is in thermal contact with the holder 70 via the heat conductive adhesive 82. Thus, heat generated by the light incident on the electro-optical panel 100 is discharged toward the holder 70, which is forcibly cooled by a cooling fan. Thus, the above-described temperature distribution is obtained. Therefore, the semiconductor element 140 of the electrostatic protection circuit 14 is disposed in a position in which the temperature is lower than the temperature of a position in which the temperature detection element 13 of the first substrate 10 is provided. In the present exemplary embodiment, the entire electrostatic protection circuit 14 including the semiconductor element 140 is disposed in the position to which the distance from the center C of the pixel region 110 of the first substrate 10 is greater than the distance from the center C of the pixel region 110 to the temperature detection element 13, and the entire electrostatic protection circuit 14 including the semiconductor element 140 is disposed in the position in which the temperature is lower than the temperature of the position in which the temperature detection element 13 of the first substrate 10 is provided. For example, when the center C of the pixel region 110 is approximately 70° C., the temperature in the vicinity of the temperature detection element 13 is approximately 65° C., and if the semiconductor element 140 of the electrostatic protection circuit 14 is disposed in a position close to a substrate edge of the second substrate 20, the temperature of the semiconductor element can be lowered to approximately 40° C.

In the present exemplary embodiment, the temperature detection element 13 is provided between the pixel region 110 and a substrate edge of the first substrate 10, and the electrostatic protection circuit 14 is provided between the temperature detection element 13 and the substrate edge of the first substrate 10. More specifically, the temperature detection element 13 is provided, between the pixel region 110 and the substrate edge of the first substrate 10, in a position overlapping with the light shielding portion 25 of the second substrate 20, and the electrostatic protection circuit 14 is provided between the light shielding portion 25 and the substrate edge of the first substrate 10. For example, of four corners of the light shielding portion 25, the temperature detection element 13 is provided in a position overlapping with a corner 251 facing a corner 107 provided between the first long side portion 101 and the first short-side portion 103 of the first substrate 10, and the electrostatic protection circuit 14 is provided in the vicinity of the corner 107 of the protruding portion 105 that does not overlap with the second substrate 20. In other words, the electrostatic protection circuit 14, particularly, the semiconductor element 140 is disposed in a position closer to the first short-side portion 103 side with respect to the terminals 111a and 111b of the temperature detection circuit, as illustrated in FIG. 4. In other words, a positional relationship between at least the semiconductor element 140 of the electrostatic protection circuit 14 of the temperature detection circuit and the terminals 111a and 111b differs from a positional relationship between an electrostatic protection circuit 150 provided in another signal line 151 and the corresponding terminals 111. In this way, the distance from the center C of the pixel region 110 of the first substrate 10 to the semiconductor element 140 can be increased. In other words, the semiconductor element 140 can be disposed in a position on the first substrate 10 at which the temperature is low. Further, the temperature detection element 13 is provided in a position closer to the pixel region 110 than to the center in the width direction of the light shielding portion 25.

Main Effects of Present Exemplary Embodiment

As described above, in the present exemplary embodiment, since the temperature detection element 13 is provided on the first substrate 10 that is used for the electro-optical panel 100, the electro-optical apparatus 1 and a projection-type display apparatus, which will be described below, can be controlled on the basis of a detection result of the temperature. Further, since the electrostatic protection circuit 14 is provided on the first substrate 10, the temperature detection element 13 can be protected from the surge. Further, when the temperature in the vicinity of the pixel region 110 of the electro-optical panel 100 is detected, a temperature in a position in which the temperature of the liquid crystal layer is highest can be easily estimated by a heat distribution simulation or the like. Thus, in the present exemplary embodiment, the temperature detection element 13 is disposed in the vicinity of the pixel region 110, and the entire electrostatic protection circuit 14 including the semiconductor element 140 is disposed in the position to which the distance from the center C of the pixel region 110 of the first substrate 10 is greater than the distance from the center C of the pixel region 110 to the temperature detection element 13. Therefore, the entire electrostatic protection circuit 14 including the semiconductor element 140 is disposed in the position at which the temperature is lower than the temperature of the position in which the temperature detection element 13 of the first substrate 10 is provided. Thus, the temperature characteristics of the output voltage of the temperature detection circuit can be inhibited from significantly deviating from the temperature characteristics of the temperature detection element 13, particularly in the high-temperature range, as a result of being affected by the leakage current Ir generated when the temperature of the semiconductor element 140 has risen, and the temperature of the pixel region 110 can thus be appropriately monitored.

Second Exemplary Embodiment

Figure 7:
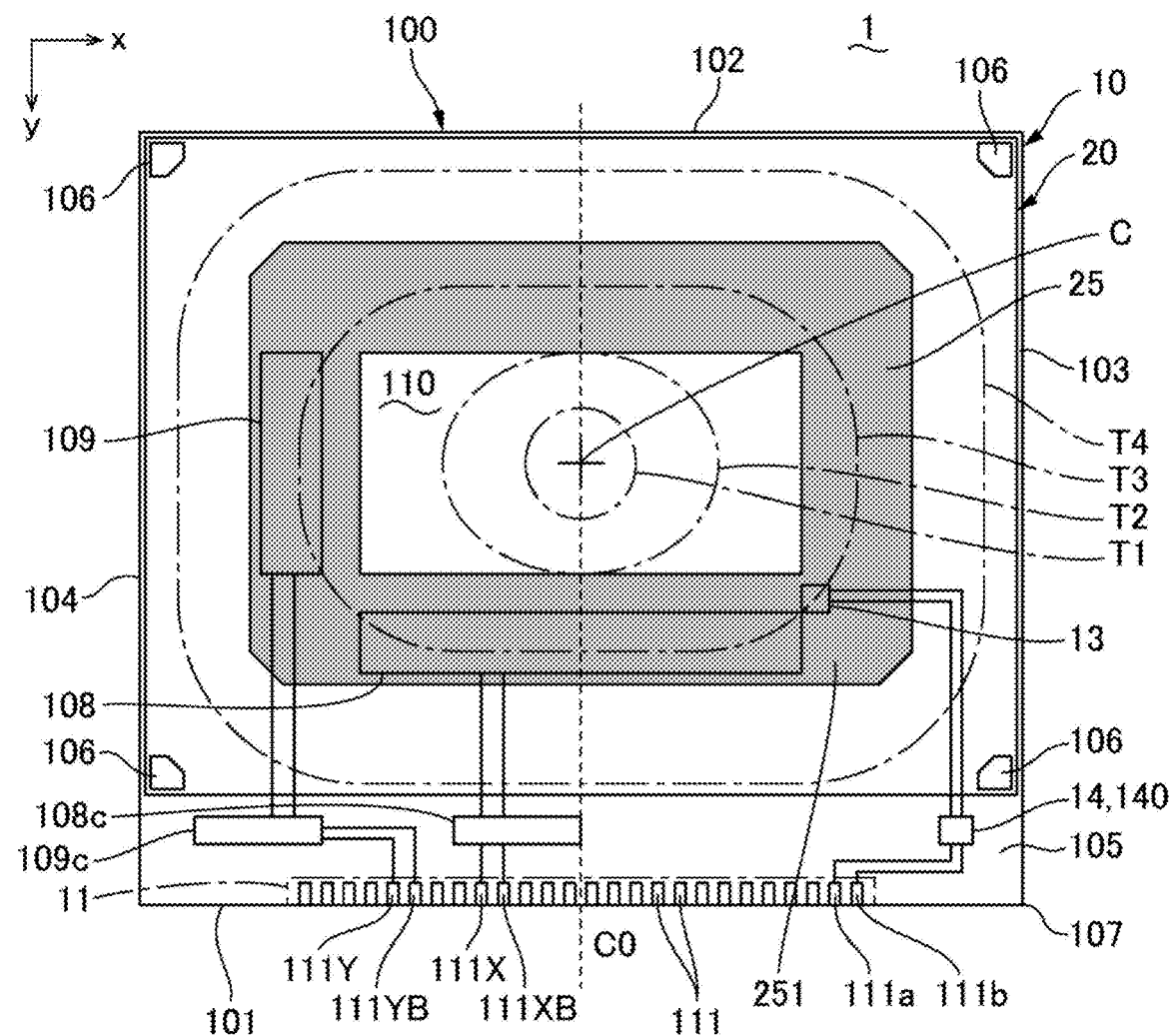
FIG. 7 is an explanatory diagram illustrating the electro-optical device according to a second exemplary embodiment of the present disclosure.

FIG. 7 is an explanatory diagram of the electro-optical device 1 according to a second exemplary embodiment of the present disclosure, and schematically illustrates a planar configuration of the electro-optical panel 100. Note that a basic configuration of the present exemplary embodiment is the same as that of the first exemplary embodiment, and thus, common portions are denoted by the same reference signs and descriptions thereof will be omitted.

As illustrated in FIG. 7, in the electro-optical device 1 according to the present exemplary embodiment as well, similarly to the first exemplary embodiment, on the first substrate 10, of the four corners of the light shielding portion 25, the temperature detection element 13 is provided in a position overlapping with the corner 251 facing the corner 107 of the first substrate 10, and the entire electrostatic protection circuit 14 including the semiconductor element 140 is provided in the vicinity of the corner 107 of the protruding portion 105. Therefore, since the temperature of the semiconductor element 140 can be inhibited from increasing due to the heat generated in the pixel region 110, the temperature of the pixel region 110 can be properly monitored.

In the present exemplary embodiment, the terminals 111 of the first substrate 10 include clock signal input terminals 111X, 111XB, 111Y, and 111YB. Further, the first substrate 10 includes a clock signal generation circuit 108c that generates and outputs clock signals output to the data line drive circuit 108 on the basis of signals input from the terminals 111X and 111XB, and a clock signal generation circuit 109c that generates and outputs clock signals output to the scanning line drive circuit 109 on the basis of signals input from the terminals 111Y and 111YB. In the present exemplary embodiment, the clock signal generation circuits 108c and 109c are each provided with a large buffer circuit to drive a signal line having a large capacity load. Further, the clock signal generation circuits 108c and 109c each have a high drive frequency. In addition, a through-current exists due to a level-shift circuit, a phase difference correction circuit that corrects a phase between the clock signals forming a pair, or the like. Thus, the clock signal generation circuit 108c and 109c are circuits that consume a large amount of power and generate a large amount of heat.

Note that, with respect to the data line drive circuit 108, the present disclosure can be applied to a partial driver driving system, in which image signals are supplied from a common image signal line to a plurality of data lines using a demultiplexing circuit, as well as to a phase development driving system described in the present exemplary embodiment. In the case of the partial driver driving system, the data line drive circuit 108 illustrated in FIG. 7 is replaced by the demultiplexing circuit, and the clock signal generation circuit 108c is replaced by a buffer circuit of a selection signal line that controls the turning on and off of a switch configuring the demultiplexing circuit. The switch of the demultiplexing circuit is configured by a plurality of n-type field effect transistors, for example. A gate electrode of the switch is coupled to the selection signal line, one of a source electrode and a drain electrode of the switch is coupled to an image signal line (not illustrated) that is commonly provided for each of eight pixel rows, for example, and the other of the source electrode and the drain electrode of the switch is coupled to a data line (not illustrated). The buffer circuit of the selection signal line is, for example, a circuit to which inverters are coupled in multiple stages. The clock signal input terminals (111X and 111XB) are replaced by terminals for inputting a selection signal SEL and its inverted signal SELXB of the selection signal line. If the demultiplexing circuit is configured to have eight data lines as one unit, eight sets of the selection signal SEL and its inverted signal SELXB are input. In that case, the buffer circuit of the selection signal line has a large driving load and a large drive frequency. Therefore, the power consumption is large and the amount of heat generated is large. The amount of heat generated tends to increase further due to an increased definition of the electro-optical panel 100.

Thus, in the present exemplary embodiment, the entire electrostatic protection circuit 14 including the semiconductor element 140 is provided on one side (the first short-side portion 103 side) of a center line C0 indicating the center in the arrangement direction of the plurality of terminals 111, and the clock signal generation circuits 108c and 109c are disposed on the other side (the second short-side portion 104 side) of the center line C0. Specifically, the semiconductor element 140 is provided in a position biased toward the one side from the center in the arrangement direction of the plurality of terminals 111, and the clock signal generation circuits 108c and 109c are provided in a position biased toward the other side from the center in the arrangement direction. Therefore, since the temperature of the semiconductor element 140 can be inhibited from increasing due to the heat generated in the clock signal generation circuits 108c and 109c, the temperature of the pixel region 110 can be properly monitored. The heat generated in the clock signal generation circuits 108c and 109c is discharged along a path leading to the closest portion to which the conductive adhesive 82 is applied, such as the substrate edge of the second substrate 20 corresponding to the second short-side portion 104, for example. As a result, the effect on the semiconductor element 140 of the heat generated in the clock signal generation circuits 108c and 109c is reduced.

Note that in the case of the partial driver driving system, the effect on the semiconductor element 140 of the heat generated in the buffer circuit of the selection signal line of the demultiplexing circuit is reduced.

Third Exemplary Embodiment

Figure 8:
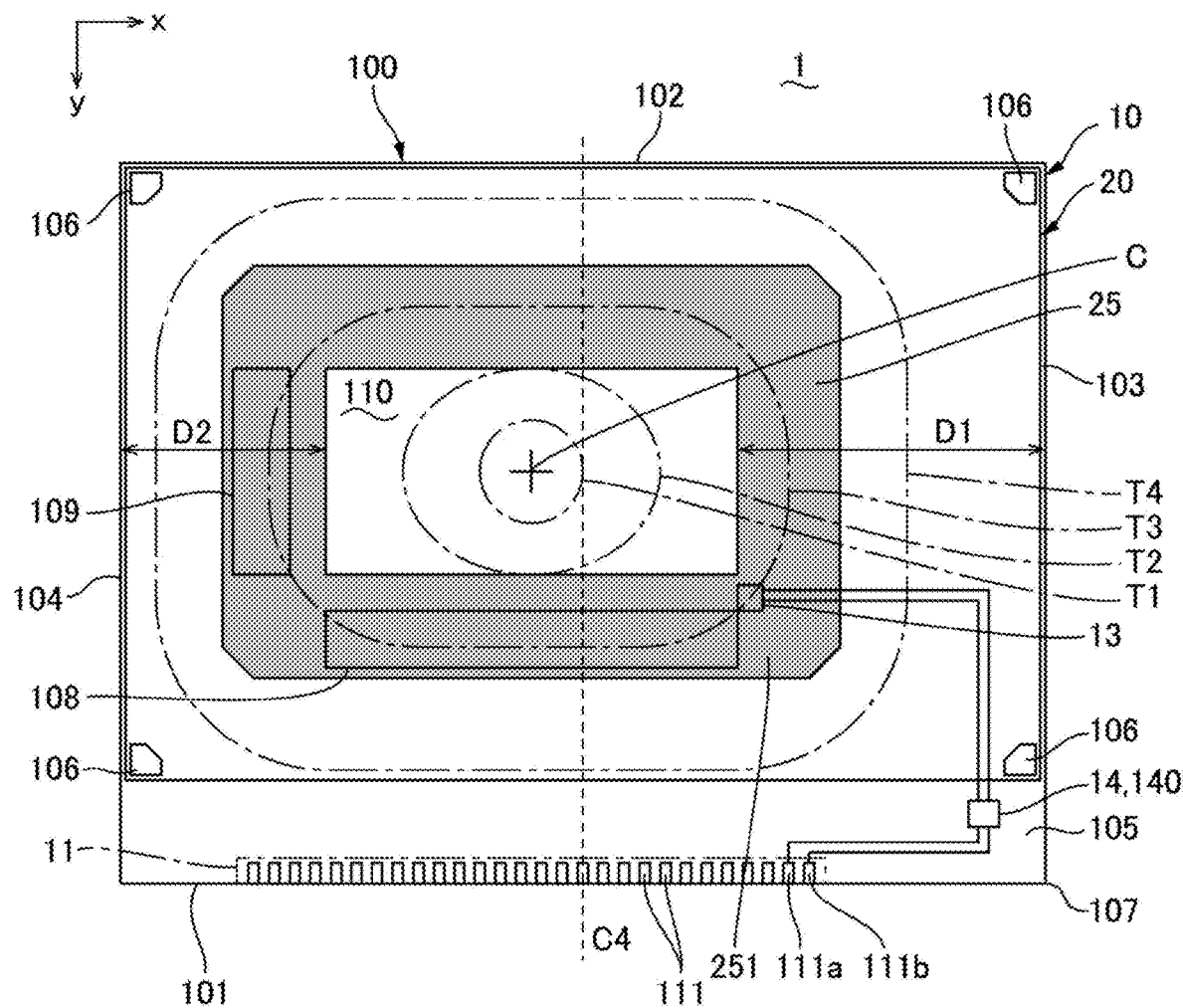
FIG. 8 is an explanatory diagram illustrating the electro-optical device according to a third exemplary embodiment of the present disclosure.

FIG. 8 is an explanatory diagram of the electro-optical device 1 according to a third exemplary embodiment of the present disclosure, and schematically illustrates a planar configuration of the electro-optical panel 100. Note that a basic configuration of the present exemplary embodiment is the same as that of the first exemplary embodiment, and thus, common portions are denoted by the same reference signs and descriptions thereof will be omitted.

As illustrated in FIG. 8, in the electro-optical device 1 according to the present exemplary embodiment also, similarly to the first exemplary embodiment, on the first substrate 10, the temperature detection element 13 is provided in a position overlapping with the light shielding portion 25, and the entire electrostatic protection circuit 14 including the semiconductor element 140 is provided on the protruding portion 105. Therefore, since the temperature of the semiconductor element 140 can be inhibited from increasing due to the heat generated in the pixel region 110, the temperature of the pixel region 110 can be properly monitored.

Here, a distance D1 between the first short-side portion 103 of the first substrate 10 and the pixel region 110 is greater than a distance D2 between the second short-side portion 104 of the first substrate 10 and the pixel region 110. Thus, the center C of the pixel region 110 is positioned closer to the second short-side portion 104 side than to a center line C4 passing through the center of the first long side portion 101 of the first substrate 10. Such a configuration is employed when the electro-optical panel 100 is a liquid crystal display device, and a liquid crystal injection port (not illustrated) is provided in the first short-side portion 103. Since a distance from the liquid crystal injection port to the pixel region 110 is increased, a risk of impurities penetrating a seal material of the liquid crystal injection port and reaching the pixel region 110 is reduced. This is effective in terms of reducing a risk of the impurities entering from the seal material of the liquid crystal injection port penetrating the pixel region 110 and causing a display failure. In the present exemplary embodiment, the entire electrostatic protection circuit 14 including the semiconductor element 140 is provided closer to the first short-side portion 103 side than to the pixel region 110. Therefore, the entire electrostatic protection circuit 14 including the semiconductor element 140 is provided in the vicinity of the corner 107, between the first long side portion 101 and the first short-side portion 103, of the protruding portion 105, and a distance between the center C of the pixel region 110 and the semiconductor element 140 is greater than that in the mode illustrated in FIG. 4. As a result, since the temperature of the semiconductor element 140 can be inhibited from increasing due to the heat from the pixel region 110, the temperature of the pixel region 110 can be properly monitored.

Fourth Exemplary Embodiment

Figure 9:
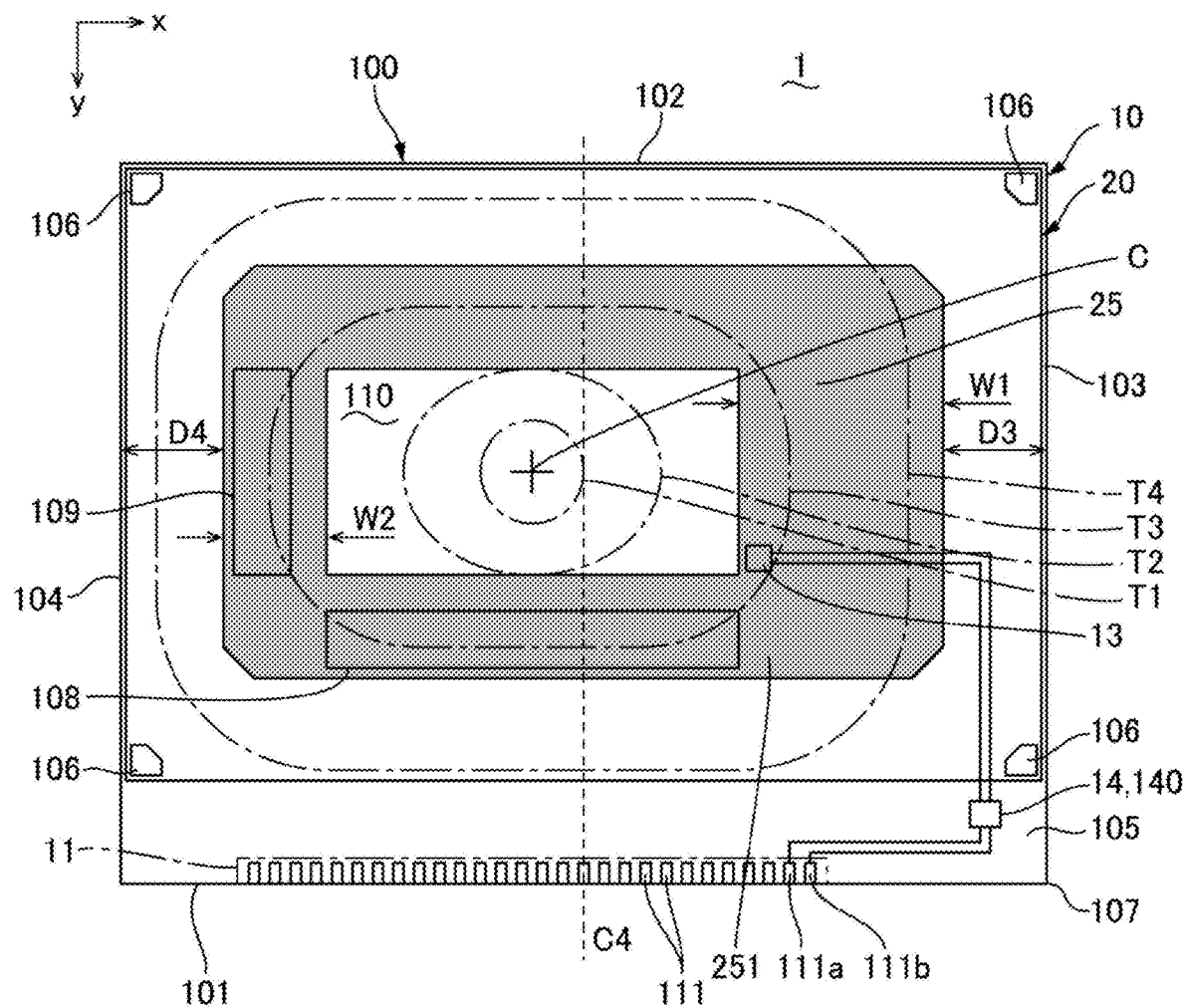
FIG. 9 is an explanatory diagram illustrating the electro-optical device according to a fourth exemplary embodiment of the present disclosure.

FIG. 9 is an explanatory diagram of the electro-optical device 1 according to a fourth exemplary embodiment of the present disclosure, and schematically illustrates a planar configuration of the electro-optical panel 100. Note that a basic configuration of the present exemplary embodiment is the same as that of the first exemplary embodiment, and thus, common portions are denoted by the same reference signs and descriptions thereof will be omitted.

As illustrated in FIG. 9, in the electro-optical device 1 according to the present exemplary embodiment also, similarly to the first exemplary embodiment, on the first substrate 10, the temperature detection element 13 is provided in a position overlapping with the light shielding portion 25, and the entire electrostatic protection circuit 14 including the semiconductor element 140 is provided on the protruding portion 105. Therefore, since the temperature of the semiconductor element 140 can be inhibited from increasing due to the heat generated in the pixel region 110, the temperature of the pixel region 110 can be properly monitored.

Here, a portion of the light shielding portion 25 is wider than the other portions thereof, and in the present exemplary embodiment, the temperature detection element 13 is provided in a position overlapping with the wider portion of the light shielding portion 25. In the present exemplary embodiment, a width W1 of a portion, of the light shielding portion 25, extending between the pixel region 110 and the first short-side portion 103 is wider than a width W2 of a portion, of the light shielding portion 25, extending between the pixel region 110 and the second short-side portion 104, and the temperature detection element 13 is provided in a position overlapping with the light shielding portion 25 between the pixel region 110 and the first short-side portion 103. When the electro-optical panel 100 is the liquid crystal display device, a peripheral circuit of the pixel region 110 is preferably disposed below the light shielding portion 25. Reasons for this will be described below in detail. In the liquid crystal display device, the seal material (not illustrated) is present so as to surround the periphery of the light shielding portion 25. In order to increase a bonding accuracy between the first substrate 10 and the second substrate 20, an ultraviolet-curable seal material is used instead of a thermosetting seal material, for example. Further, in order to ensure curing of the ultraviolet-curable seal material, ultraviolet light is preferably irradiated from the front surface and the back surface of the electro-optical panel 100. Therefore, it is difficult to dispose the peripheral circuit, which shields the seal material, in a region from the light shielding portion 25 to the end portion of the second substrate 20. Here, when the temperature detection element 13 is disposed in a region in which the width of the light shielding portion 25 is increased as in the present exemplary embodiment, the arrangement of the temperature detection element 13 is facilitated while avoiding the scanning line drive circuit 109, for example. Therefore, it becomes easier to increase a number of series couplings of the diodes configuring the temperature detection element 13, for example, in order to further increase the detection sensitivity to the temperature change, and the high-performance temperature detection circuit can thus be realized.

Specifically, although a distance D3 between the first short-side portion 103 of the first substrate 10 and the light shielding portion 25 is equal to a distance D4 between the second short-side portion 104 of the first substrate 10 and the light shielding portion 25, the width W1 of the portion, of the light shielding portion 25, extending between the pixel region 110 and the first short-side portion 103 is wider than the width W2 of the portion, of the light shielding portion, extending between the pixel region 110 and the second short-side portion 104. Thus, the center C of the pixel region 110 is positioned closer to the second short-side portion 104 side than to the center line C4 passing through the center of the first long side portion 101 of the first substrate 10. Therefore, the electrostatic protection circuit 14 is separated from the center C of the pixel region 110. As a result, since the temperature of the semiconductor element 140 can be suppressed from increasing due to the heat from the pixel region 110, the temperature of the pixel region 110 can be properly monitored.

Fifth Exemplary Embodiment

Figure 10A:
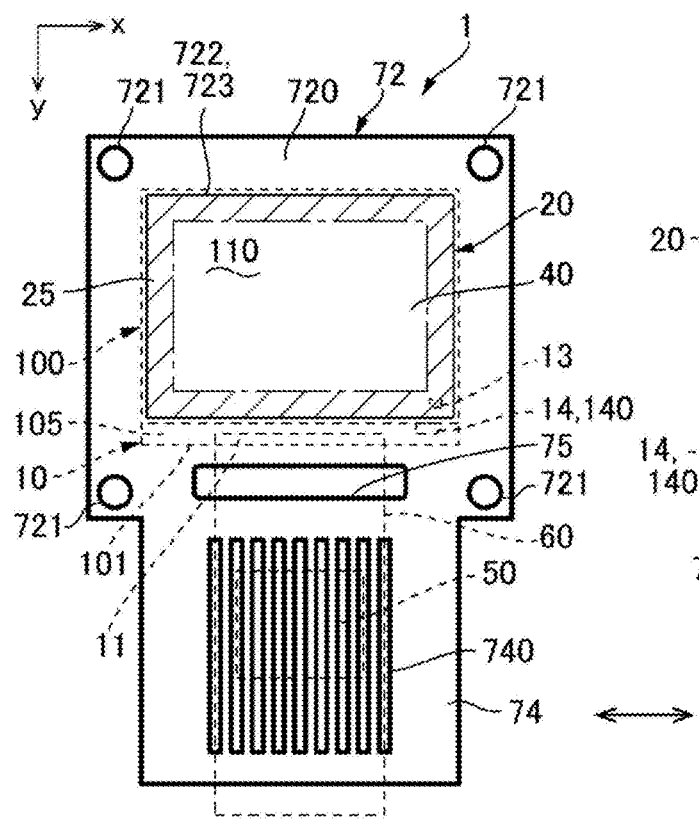
FIGS. 10A and 10B are explanatory diagrams illustrating the electro-optical device according to a fifth exemplary embodiment of the present disclosure.
Figure 10B:
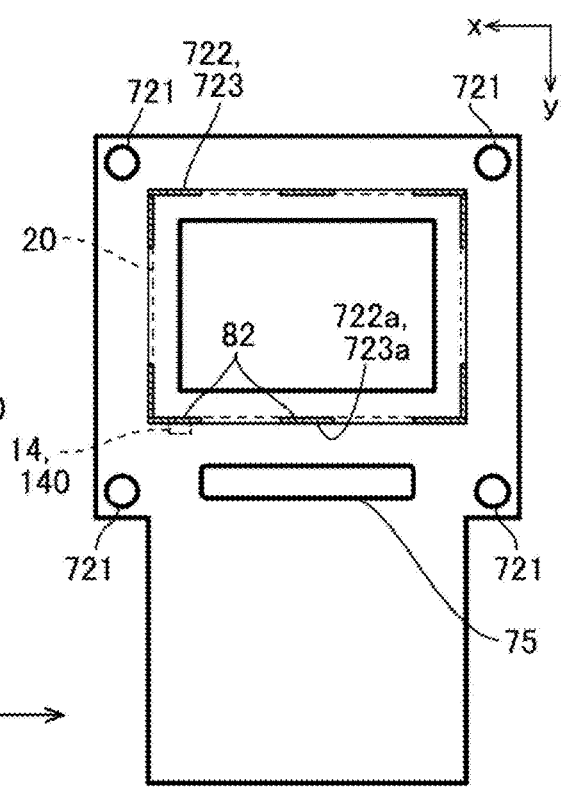

FIGS. 10A and 10B are explanatory diagrams of the electro-optical device 1 according to a fifth embodiment of the present disclosure. FIG. 10A illustrates a plan view of the second holder member 72 and the like as viewed from an incidence side of the illumination light, and FIG. 10B is a plan view of the second holder member 72 and the like as viewed from the opposite side to the incidence side of the illumination light. Note that a basic configuration of the present exemplary embodiment is the same as the first exemplary embodiment, and thus, common portions are denoted by the same reference signs and descriptions thereof will be omitted.

As illustrated in FIGS. 10A and 10B, in the electro-optical device 1 according to the present exemplary embodiment also, similarly to the first exemplary embodiment, on the first substrate 10, the temperature detection element 13 is provided in a position overlapping with the light shielding portion 25, and the entire electrostatic protection circuit 14 including the semiconductor element 140 is provided on the protruding portion 105. Therefore, since the temperature of the semiconductor element 140 can be inhibited from increasing due to the heat generated in the pixel region 110, the temperature of the pixel region 110 can be properly monitored.

Further, in the present exemplary embodiment also, as described above with reference to FIG. 3, the second holder member 72 is fixed to the second substrate 20 and the second dust-proof glass 40 by the heat conductive adhesive 82 provided on the stepped portion 722b of the substrate arrangement hole 722 and the side wall 723a of the first recessed portion 723. Here, the electrostatic protection circuit 14 including the semiconductor element 140 is provided in a position, of the first substrate 10, overlapping with the side wall 723a of the first recessed portion 723, or in the vicinity of the position overlapping with the side wall 723a, and the heat conductive adhesive 82 is provided, as a heat conduction member, on a side of the side wall 723a on which the electrostatic protection circuit 14 is positioned. Therefore, heat attempting to be transferred from the pixel region 110 to the semiconductor element 140 can be dissipated to the second holder member 72 via the heat conductive adhesive 82 (the heat conduction member). As a result, since the temperature of the semiconductor element 140 can be suppressed from increasing due to the heat from the pixel region 110, the temperature of the pixel region 110 can be properly monitored. Of course, the heat conductive adhesive 82 may be provided around the entire periphery of the second substrate 20 and the second dust-proof glass 40.

Sixth Exemplary Embodiment

Figure 11A:
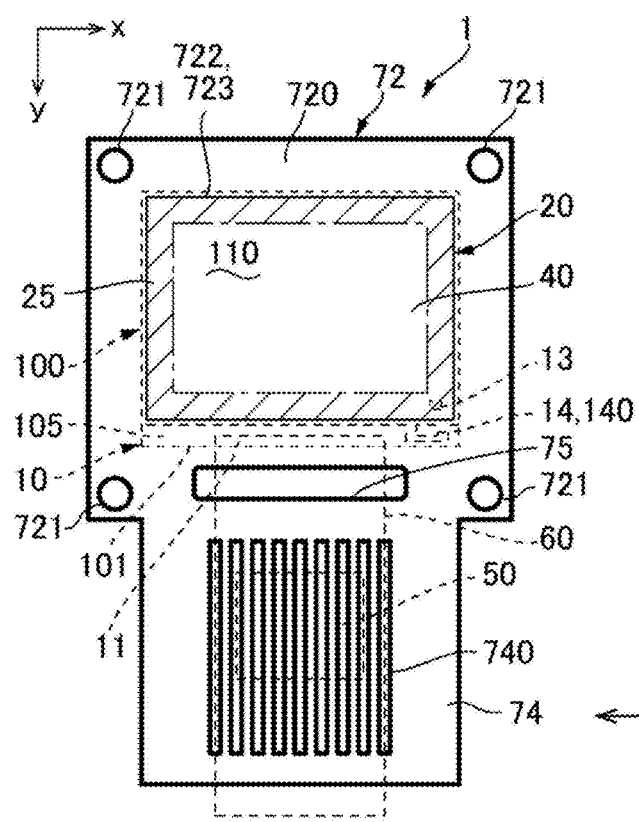
FIGS. 11A and 11B are explanatory diagrams illustrating the electro-optical device according to a sixth exemplary embodiment of the present disclosure.
Figure 11B:
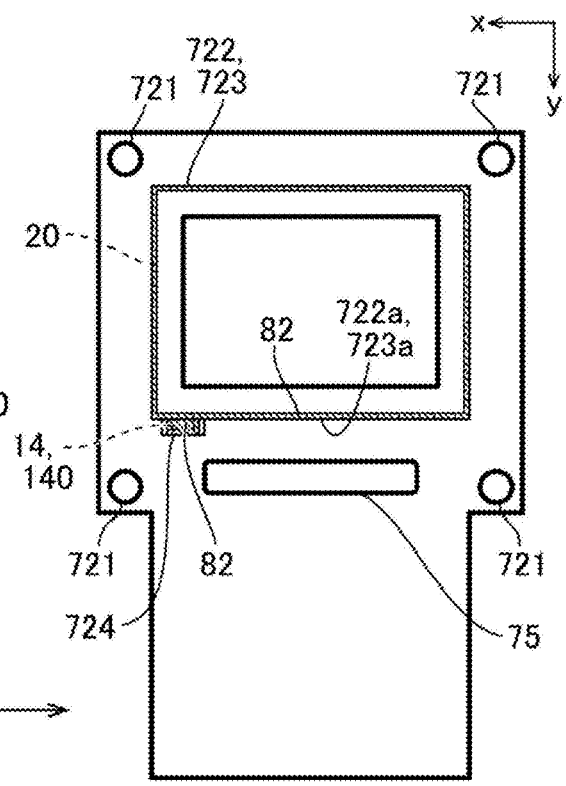

FIGS. 11A and 11B are explanatory diagrams of the electro-optical device 1 according to a sixth embodiment of the present disclosure. FIG. 11A illustrates a plan view of the second holder member 72 and the like as viewed from the incidence side of the illumination light, and FIG. 11B is a plan view of the second holder member 72 and the like as viewed from the opposite side to the incidence side of the illumination light. Note that a basic configuration of the present exemplary embodiment is the same as that of the first exemplary embodiment, and thus, common portions are denoted by the same reference signs and descriptions thereof will be omitted.

As illustrated in FIGS. 11A and 11B, in the electro-optical device 1 according to the present exemplary embodiment also, similarly to the first exemplary embodiment, on the first substrate 10, the temperature detection element 13 is provided in a position overlapping with the light shielding portion 25, and the entire electrostatic protection circuit 14 including the semiconductor element 140 is provided on the protruding portion 105. Therefore, since the temperature of the semiconductor element 140 can be inhibited from increasing due to the heat generated in the pixel region 110, the temperature of the pixel region 110 can be properly monitored.

Further, in the present exemplary embodiment as well, as described above with reference to FIG. 3, the second holder member 72 is fixed to the second substrate 20 and the second dust-proof glass 40 by the heat conductive adhesive 82 provided on the stepped portion 722b of the substrate arrangement hole 722 and the side wall 723a of the first recessed portion 723. In the present exemplary embodiment, the heat conductive adhesive 82 is provided over the entire circumference of the second substrate 20.

Here, the electrostatic protection circuit 14 including the semiconductor element 140 is provided in a position, of the first substrate 10, overlapping with the side wall 723a of the first recessed portion 723, or in the vicinity of the position overlapping with the side wall 723a. In the present exemplary embodiment, a second recessed portion 724 overlapping with the electrostatic protection circuit 14 is formed on a surface of the second holder member 72 on the second substrate 20 side, and the heat conductive adhesive 82 is provided in the second recessed portion 724 as the heat conduction member.

In a case in which the electro-optical device 1 is a light valve of the projection-type display apparatus, the holder 70 is forcibly cooled by a cooling fan. Therefore, the second holder member 72, which is a part of the holder 70, is the coldest portion of the electro-optical device 1 during a period when it is being illuminated. For example, when the center C of the pixel region 110 is approximately 70° C., the second holder member 72 is 40° C. or lower. In other words, by increasing the thermal contact between the semiconductor element 140 and the second holder member 72 via the heat conductive adhesive 82 (the heat conduction member), cooling of the semiconductor element 140 can be promoted and the temperature increase can be suppressed. As a result, since the temperature of the semiconductor element 140 can be inhibited from increasing due to the heat from the pixel region 110, the temperature of the pixel region 110 can be properly monitored. Since the second recessed portion 724 is provided, an application position of the heat conductive adhesive 82 is reliably identified. When the heat conductive adhesive 82 is applied to the second recessed portion 724, the heat conductive adhesive 82 is easily brought into contact with the electrostatic protection circuit 14. Since the second recessed portion 724 is the recessed portion, an application range of the heat conductive adhesive 82 is automatically determined. The second recessed portion 724 is not limited to the recessed portion, and may be formed as a slightly raised convex portion, which is flat enough not to come into contact with the first substrate 10, for example. In this case also, the application position of the heat conductive adhesive 82 is reliably identified, and when the heat conductive adhesive 82 is applied to the convex portion, the heat conductive adhesive 82 is easily brought into contact with the electrostatic protection circuit 14. Further, when the second recessed portion 724 is the convex portion, the heat conductive adhesive 82 is more reliably brought into contact with the electrostatic protection circuit 14.

Seventh Exemplary Embodiment

Figure 12A:
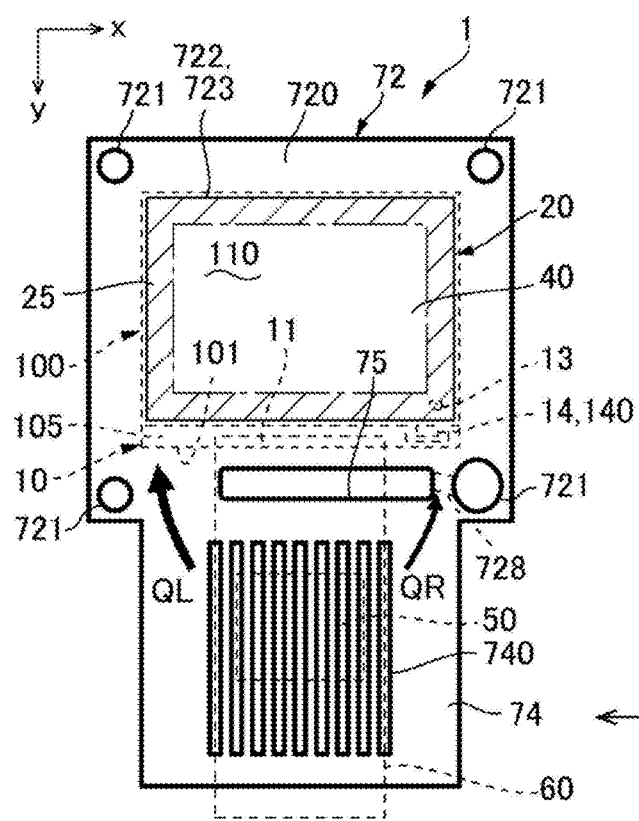
FIGS. 12A and 12B are explanatory diagrams illustrating the electro-optical device according to a seventh exemplary embodiment of the present disclosure.
Figure 12B:
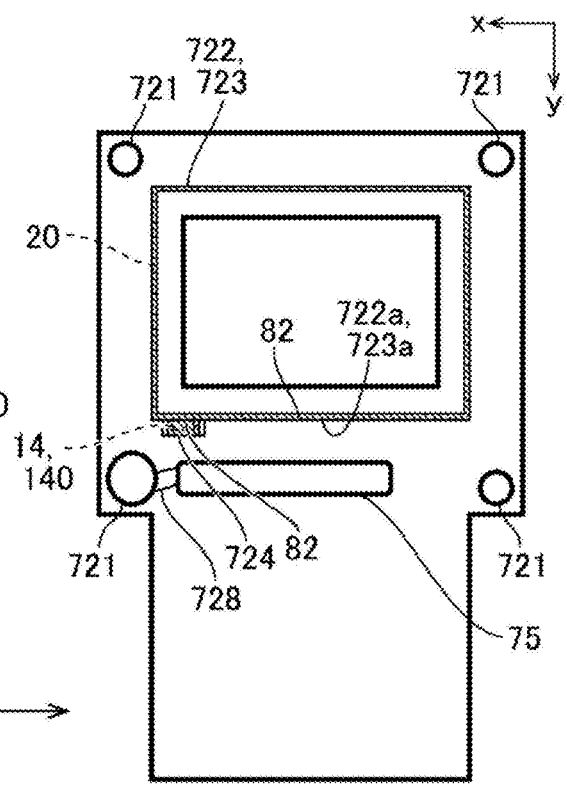

FIGS. 12A and 12B are explanatory diagrams of the electro-optical device 1 according to a seventh embodiment of the present disclosure. FIG. 12A illustrates a plan view of the second holder member 72 and the like as viewed from the incidence side of the illumination light, and FIG. 12B is a plan view of the second holder member 72 and the like as viewed from the opposite side to the incidence side of the illumination light. Note that a basic configuration of the present exemplary embodiment is the same as the first exemplary embodiment, and thus, common portions are denoted by the same reference signs and descriptions thereof will be omitted.

As illustrated in FIGS. 12A and 12B, in the electro-optical device 1 according to the present exemplary embodiment also, similarly to the first exemplary embodiment, on the first substrate 10, the temperature detection element 13 is provided in a position overlapping with the light shielding portion 25, and the entire electrostatic protection circuit 14 including the semiconductor element 140 is provided on the protruding portion 105. Therefore, since the temperature of the semiconductor element 140 can be inhibited from increasing due to the heat generated in the pixel region 110, the temperature of the pixel region 110 can be properly monitored.

Further, in the present exemplary embodiment also, similarly to the sixth exemplary embodiment, the second holder member 72 is fixed to the second substrate 20 and the second dust-proof glass 40 by the heat conductive adhesive 82 provided on the stepped portion 722b of the substrate arrangement hole 722 and the side wall 723a of the first recessed portion 723. In the present exemplary embodiment, the heat conductive adhesive 82 is provided over the entire circumference of the second substrate 20. Further, the second recessed portion 724 overlapping with the electrostatic protection circuit 14 is formed in the second holder member 72, and the heat conductive adhesive 82 is provided in the second recessed portion 724 as the heat conduction member. In other words, by increasing the thermal contact between the semiconductor element 140 and the second holder member 72 via the heat conductive adhesive 82 (the heat conduction member), the cooling of the semiconductor element 140 can be promoted and the temperature increase can be suppressed. As a result, since the temperature of the semiconductor element 140 can be inhibited from increasing due to the heat from the pixel region 110, the temperature of the pixel region 110 can be properly monitored.

In the present exemplary embodiment, the second holder member 72 is provided with the slit-shaped through-hole 75 between the drive IC 50 and the electrostatic protection circuit 14 including the semiconductor element 140, in the extending direction (the y-axis direction) of the wiring substrate 60. Here, the electrostatic protection circuit 14 including the semiconductor element 140 is provided in a position biased toward one side from the center in the width direction (the x-axis direction) intersecting the extending direction of the wiring substrate 60, and the through-hole 75 is provided in a position biased toward the one side from the center in the width direction. Therefore, when comparing a first heat transfer path QR extending from the drive IC 50 on one side of the through-hole 75 with a second heat transfer path QL extending from the drive IC 50 on the other side of the through-hole 75, heat transfer resistance is larger in the first heat transfer path QR.

Further, in the present exemplary embodiment, in a surface of the second holder member 72 on the side on which the first substrate 10 is positioned, the bolt hole 721 positioned on the one side of the through-hole 75 is communicated with the through-hole 75 by a groove 728. Since the groove 728 is used, the rigidity of the second holder member 72 does not excessively decrease. The groove 728 may be provided in a surface of the second holder member 72 on which the heat dissipation fins 740 are provided. The groove 728 need not necessarily cause the bolt hole 721 to be communicated with the through-hole 75. In either of the configurations, the heat transfer resistance in the first heat transfer path QR is further increased by the groove 728. Thus, since the temperature of the semiconductor element 140 can be inhibited from increasing due to heat from the drive IC 50, the temperature of the pixel region 110 can be properly monitored.

Further, as illustrated in FIGS. 12A and 12B, of the four bolt holes 721 that join the first holder member 71 and the second holder member 72 using the bolts, the bolt hole 721 closest to the electrostatic protection circuit 14 may have an inner diameter greater than that of the other bolt holes 721 and may be fastened with a thicker bolt. In this case, although not illustrated, the bolt hole 711 of the first holder member 71 is also made larger. Specifically, among a plurality of the bolts that couple the first holder member 71 with the second holder member 72, the bolt closest to the semiconductor element 140 may have a thickest possible form. In other words, the bolt hole of the holder 70 closest to the semiconductor element 140 may be the largest possible bolt hole. When the electro-optical device 1 is a light valve, if all of the bolt holes 711 and 721 in the four positions are enlarged, the size of the holder 70 increases, and it is thus difficult to downsize the electro-optical device 1. However, if only one of the positions on the wiring substrate 60 side is enlarged, an increase in size of the holder 70 can be suppressed. According to such a configuration, the heat transfer resistance in the bolt holes 711 and 721 closest to the electrostatic protection circuit 14 can be reduced, and the heat dissipation efficiency of the holder 70 is thus improved. As a result, heat of the electrostatic protection circuit 14 can be efficiently dissipated. Thus, the temperature of the semiconductor element 140 can be inhibited from increasing, and the temperature of the pixel region 110 can thus be properly monitored. Note that the bolt for the bolt hole 721 closest to the electrostatic protection circuit 14 may be the same bolt as those for the other bolt holes 721, and may be formed in an oval shape that is long in the x-axis direction, instead of being formed in a circular shape. In other words, the bolt hole 721 closest to the electrostatic protection circuit 14 is larger than the bolt holes 721 in the other positions. In this case, since the heat transfer resistance of the first heat transfer path QR can be increased in the same manner as in the cases of the through-hole 75 and the groove 728, the effect of the heat from the drive IC 50 can be reduced. Thus, the temperature of the semiconductor element 140 can be inhibited from increasing, and the temperature of the pixel region 110 can thus be properly monitored.

Other Exemplary Embodiments

In the above-described exemplary embodiments, the entire electrostatic protection circuit 14 including the semiconductor element 140 is provided in the position to which the distance from the center C of the pixel region 110 is greater than the distance from the center C of the pixel region 110 to the position at which the temperature detection element 13 is provided, and in which the temperature is lower than the temperature at the position in which the temperature detection element 13 is provided. However, only the semiconductor element 140 may be provided in the position to which the distance from the center C of the pixel region 110 is greater than the distance from the center C of the pixel region 110 to the position in which the temperature detection element 13 is provided, and in which the temperature is lower than the temperature at the position in which the temperature detection element 13 is provided.

Although the electro-optical device 1 is the transmission-type liquid crystal device in the above-described exemplary embodiments, the present disclosure may also be applied to a case in which the electro-optical device 1 is a reflection-type liquid crystal device, or to a case in which the electro-optical device 1 is an organic electroluminescence device.

When the electro-optical device 1 is the reflection-type liquid crystal device, a mode is employed in which a liquid crystal panel is adhered and fixed to a single-piece holder, and a heat sink is attached to the back surface of the liquid crystal panel using a heat conductive adhesive, for example. Light incident on the pixel region causes the temperature of the liquid crystal panel to increase. On the incidence side of the light, in the periphery of the pixel region, the incident light is shielded by a substantially rectangular metal cover member provided with an opening. Thus, in this case also, the liquid crystal panel tends to have a high temperature in a central portion of the pixel region. Therefore, in accordance with the configuration of the first exemplary embodiment illustrated in FIG. 4, for example, when the electrostatic protection circuit 14 of the temperature detection circuit is disposed in the corner portion of the liquid crystal panel, it is possible to inhibit the temperature of the semiconductor element 140 configuring the electrostatic protection circuit 14 from increasing.

Example of Installation in Electronic Apparatus

Figure 13:
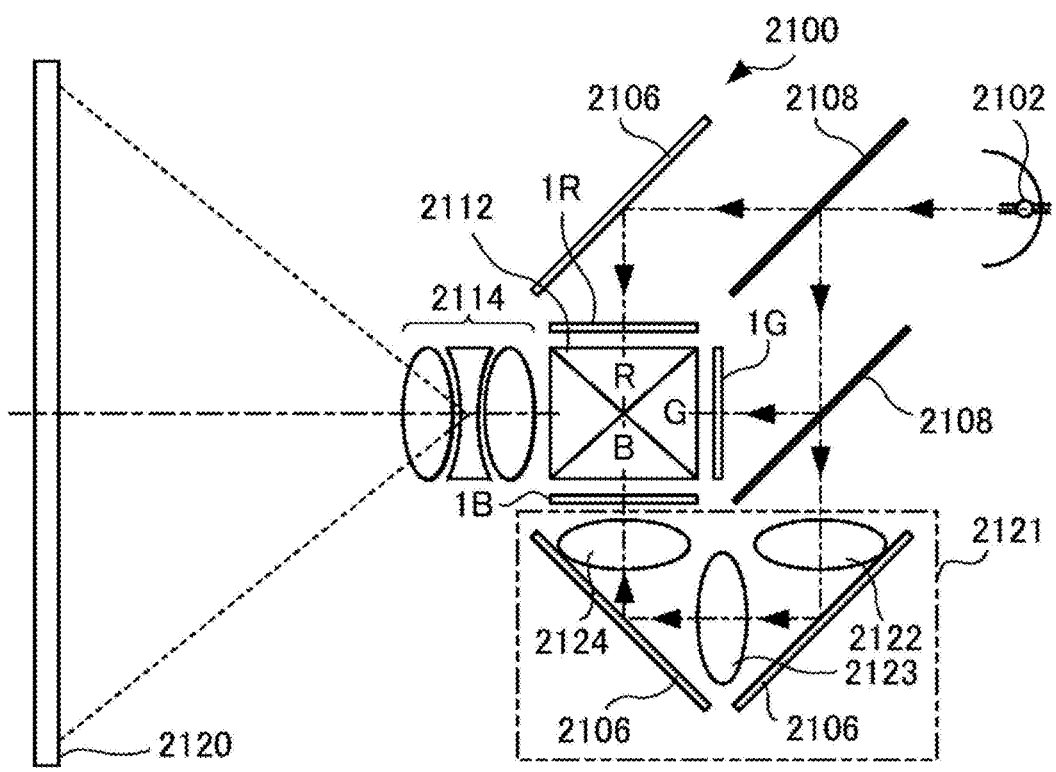
FIG. 13 is a schematic configuration view of a projection-type display device using the electro-optical device to which the present disclosure is applied.

An electronic apparatus using the electro-optical device 1 according to the above-described exemplary embodiments will be described below. FIG. 13 is a schematic configuration view of the projection-type display apparatus (the electronic apparatus) using the electro-optical device 1 to which the present disclosure is applied. A projection-type display apparatus 2100 illustrated in FIG. 13 is an example of the electronic apparatus using the electro-optical device 1. The projection-type display device 2100, in which the electro-optical device 1 is used as a light valve, can perform high-definition and bright display without increasing the size of the device. As illustrated in this drawing, a lamp unit 2104 (a light source unit) including a white light source such as a halogen lamp is provided inside the projection-type display apparatus 2100. Projection light emitted from the lamp unit 2104 is split into three primary colors of R (red), G (green), and B (blue) by three mirrors 2106 and two dichroic mirrors 2108 disposed internally. The split projection light is guided to light valves 1R, 1G, and 1B corresponding to the primary colors, respectively. Note that since the B color light has a longer optical path than that of the R color light and the G color light, in order to prevent a loss of the B color light, the B color light is guided via a relay lens system 2121 that includes an incidence lens 2122, a relay lens 2123, and an emission lens 2124.

In the projection-type display apparatus 2100, a configuration of each of the light valves 1R, 1G, and 1B is the same as that of the electro-optical device 1 described above with reference to FIG. 1 and the like, and each of the light valves 1R, 1G, and 1B is coupled to an upper circuit provided inside the projection-type display apparatus 2100, via the wiring substrate 60 illustrated in FIG. 1 and the like. Image signals specifying gray-scale levels of respective primary color components of the R color, the G color, and the B color are supplied from an external upper circuit and processed by the upper circuit inside the projection-type display device 2100 to drive the light valves 1R, 1G, and 1B, respectively. Light modulated by each of the light valves 1R, 1G, and 1B is incident on a dichroic prism 2112 from three directions. Then, at the dichroic prism 2112, the R color light and the B color light are reflected at 90 degrees, and the G color light is transmitted. As a result, images of each of the primary colors are synthesized, and subsequently, a color image is projected on a screen 2120 by a projection lens group 2114 (a projection optical system).

The projection-type display apparatus 2100 having such a configuration is provided with a cooling fan (not illustrated) for cooling the light valves 1R, 1G, and 1B. Therefore, if the cooling fan is controlled based on the detection result obtained by the temperature detection element 13 illustrated in FIG. 4 and the like, the effect of the temperature of the light valves 1R, 1G, and 1B on the image can be mitigated.

Other Projection-Type Display Apparatuses

Note that the projection-type display apparatus may have a configuration in which an LED light source or the like configured to emit light of each color is used as a light source unit, and the light of each color emitted from the LED light source is supplied to another liquid-crystal device. Note that the pixel may be configured using a display element (a MEMS device) such as a digital micromirror device (DMD).

Other Electronic Apparatuses

The electronic apparatus including the electro-optical device 1 to which the present disclosure is applied is not limited to the projection-type display device 2100 of the above-described exemplary embodiment. Examples of the electronic apparatus may include a projection-type head up display (HUD), a direct-view-type head mounted display (HMD), a personal computer, a digital still camera, and a liquid crystal television.

What is claimed is:
1. An electro-optical panel comprising:
  a first substrate having a pixel region provided with a plurality of pixels;
  a temperature detection element provided at the first substrate;

an electrostatic protection circuit provided at the first substrate and electrically coupled to the temperature detection element at the first substrate, wherein the electrostatic protection circuit includes a semiconductor element; and a second substrate, which is bonded to a surface of the first substrate, at which the plurality of pixels, the temperature detection element, and the semiconductor element are provided, wherein the temperature detection element is provided in a position overlapping the second substrate, and the semiconductor element is provided in a position not overlapping the second substrate, the position of the semiconductor element being a position at which the temperature is lower than a temperature in a position at which the temperature detection element of the first substrate is provided.

2. An electro-optical panel comprising:

a first substrate having a pixel region provided with a plurality of pixels;

a temperature detection element provided at the first substrate;

an electrostatic protection circuit provided at the first substrate and electrically coupled to the temperature detection element at the first substrate, wherein the electrostatic protection circuit includes a semiconductor element; and a second substrate, which is bonded to a surface of the first substrate, at which the plurality of pixels, the temperature detection element, and the semiconductor element are provided, wherein the temperature detection element is provided in a position overlapping the second substrate, and the semiconductor element is provided in a position not overlapping the second substrate, the position of the semiconductor element is a position further distanced from a center of the pixel region of the first substrate than the temperature detection element is.

3. The electro-optical panel according to claim 1, wherein the temperature detection element is provided between the pixel region and an end portion of the first substrate.

4. The electro-optical panel according to claim 3, wherein the first substrate is provided with a drive circuit configured to operate based on a clock signal, a plurality of terminals are arranged along any of end portions of the first substrate, the semiconductor element is provided in a position at one side of a center in an arrangement direction of the plurality of terminals; and a clock signal generation circuit configured to generate the clock signal is provided in a position at another side of the center in the arrangement direction.

5. The electro-optical panel according to claim 3, wherein a distance between a first short-side portion of the first substrate and the pixel region is greater than a distance between a second short-side portion of the first substrate and the pixel region, the second short-side portion facing the first short-side portion, and the semiconductor element is provided closer to the first short-side portion side than to the pixel region.

6. The electro-optical panel according to claim 1, wherein the second substrate is provided with a light shielding portion extending along an outer edge of the pixel region, and the temperature detection element is provided in a position overlapping the light shielding portion.

7. The electro-optical panel according to claim 6, wherein the light shielding portion has a portion having a width greater than that of other portions thereof and extending along an end portion of the second substrate, and the semiconductor element is provided between the portion of the light shielding portion and an end portion of the first substrate.

8. An electro-optical device provided with the electro-optical panel according to claim 1, the electro-optical device comprising:

a wiring substrate which is flexible and coupled to a plurality of terminals arranged along any of end portions of the first substrate; and a holder configured to hold the electro-optical panel.

9. The electro-optical device according to claim 8, wherein the holder includes:

a first holder member overlapping the electro-optical panel from the first substrate side; and a second holder member overlapping the electro-optical panel from the second substrate side, the second substrate is disposed in a first recessed portion provided in the second holder member, and a heat conduction member is provided at least at a side, on which the semiconductor element is positioned, of a section between the second substrate and a side wall of the first recessed portion.

10. The electro-optical device according to claim 9, wherein a second recessed portion is provided in the second holder member in a position overlapping the semiconductor element, and the heat conduction member is provided in the second recessed portion.

11. The electro-optical device according to claim 9, wherein an IC is mounted at the wiring substrate, and a through-hole is provided between the IC and the semiconductor element in an extending direction of the wiring substrate in the second holder member.

12. The electro-optical device according to claim 11, wherein the semiconductor element is provided in a position at one side of a center in a width direction intersecting the extending direction of the wiring substrate; and the through-hole is provided in a position at one side of the center in the width direction.

13. The electro-optical device according to claim 8, wherein the holder includes a plurality of bolt holes, and the bolt hole closest to the semiconductor element is the largest among the plurality of bolt holes.

14. An electronic apparatus comprising the electro-optical device according to claim 8.

* * * * *